US007023026B2

(12) United States Patent
Yamamoto

(10) Patent No.: US 7,023,026 B2
(45) Date of Patent: Apr. 4, 2006

(54) LIGHT EMITTING DEVICE OF III-V GROUP COMPOUND SEMICONDUCTOR AND FABRICATION METHOD THEREFOR

(75) Inventor: Kensaku Yamamoto, Chiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/076,610

(22) Filed: Mar. 9, 2005

(65) Prior Publication Data

US 2005/0199904 A1 Sep. 15, 2005

(30) Foreign Application Priority Data

Mar. 9, 2004 (JP) ............................ 2004-066189

(51) Int. Cl.
*H01L 29/24* (2006.01)
*H01L 33/00* (2006.01)

(52) U.S. Cl. ....................................... 257/103; 257/101

(58) Field of Classification Search .................... None
See application file for complete search history.

(56) References Cited

U.S. PATENT DOCUMENTS

2003/0143772 A1* 7/2003 Chen .......................... 438/47
2004/0061101 A1* 4/2004 Noto et al. .................. 257/13
2004/0166365 A1* 8/2004 Ise et al. .................... 428/690
2004/0206961 A1* 10/2004 Yamada et al. .............. 257/79
2005/0000794 A1* 1/2005 Demaray et al. ........ 204/192.1
2005/0088119 A1* 4/2005 Potucek et al. ............. 315/312

FOREIGN PATENT DOCUMENTS

JP 2002-026392 1/2002
JP 2003-163373 6/2003

* cited by examiner

*Primary Examiner*—Tu-Tu Ho
(74) *Attorney, Agent, or Firm*—Morrison & Foerster LLP

(57) ABSTRACT

A light emitting device of III–V group compound semiconductor includes a first stack and a second stack. The first stack includes a semiconductor stack including a light emitting layer. A multilayered reflective structure for reflecting light from the light emitting layer and a first metal bonding-layer are successively formed on the semiconductor stack. The second stack includes a second metal bonding-layer. The first and second stacks are bonded together by bonding the first and second metal bonding-layers to each other. The multilayered reflective structure includes a transparent conductive oxide layer and a reflective metal layer adjacent thereto in this order from the side of the semiconductor stack. The thickness of the transparent conductive oxide layer is adjusted to control the light emission characteristics.

15 Claims, 7 Drawing Sheets

LIGHT EMITTING DEVICE OF III-V GROUP COMPOUND SEMICONDUCTOR AND FABRICATION METHOD THEREFOR

This nonprovisional application is based on Japanese Patent Application No. 2004-066189 filed with the Japan Patent Office on Mar. 9, 2004, the entire contents of which are hereby incorporated by reference.

BACKGROUND OF THE INVENTION

1. Field of the Invention

The present invention relates to a light emitting device of III–V group compound semiconductor, and more particularly to improvement in efficiency of externally extracting light from a light emitting device capable of emitting blue or white light and improvement in controllability of its emission characteristics.

2. Description of the Background Art

Conventionally, a sapphire substrate has primarily been used for a light emitting device of III group compound semiconductor, and a nitride semiconductor light emitting device including such a sapphire substrate has been commercially available. Since the sapphire substrate is insulative, an electrode for a p-type semiconductor (hereinafter, referred to as "p-electrode") and an electrode for an n-type semiconductor (hereinafter, referred to as "n-electrode") are both arranged on a plurality of III group nitride semiconductor layers grown on a main surface of the substrate.

FIG. 10 is a schematic cross sectional view of a light emitting device of a compound semiconductor disclosed in Japanese Patent Laying-Open No. 2003-163373. This light emitting device includes a plurality of reflective layers. More specifically, in the light emitting device of FIG. 10, a buffer layer 82, a first reflective layer 86, an n-type layer 83, a light emitting layer 84, a p-type layer 85, a second reflective layer 87, and a p-electrode 88 are stacked successively on a sapphire substrate 81. An n-electrode 89 is formed on n-type layer 83 partially exposed. In the example shown in FIG. 10, second reflective layer 87 serves as p-electrode 88 as well.

In the light emitting device of FIG. 10, light emitted from light emitting layer 84 comes to resonate between first reflective layer 86 and second reflective layer 87, and is emitted efficiently to the outside via sapphire substrate 81, leading to improvement in optical output of the light emitting device. To this end, first reflective layer 86 has reflectance lower than that of second reflective layer 87.

Further, Japanese Patent Laying-Open No. 2002-026392 discloses provision of an electrode of high reflectance on the p-type layer side in a similar manner, to cause light from the light emitting layer to be reflected to the sapphire substrate side, to thereby improve the efficiency of externally extracting light.

In each of the light emitting devices disclosed in Japanese Patent Laying-Open Nos. 2003-163373 and 2002-026392, a metal layer of high reflectance is provided on the p-type GaN layer, and light from the active layer is reflected dependent on the device structure before being emitted via the substrate. As such, in the case that molding is carried out after dividing a wafer including the semiconductor layers into chips, extraction of light from the light emitting device is restricted with the emission characteristics dependent on the device structure. To change the emission characteristics, it is necessary to appropriately design the cup shape or mold shape in the molding.

SUMMARY OF THE INVENTION

In view of the above-described situations of the prior art, an object of the present invention is, in a light emitting device that is fabricated using III–V group compound semiconductor and is capable of emitting blue or white light, to control emission characteristics of the light emitting device while improving efficiency of externally extracting light therefrom.

A light emitting device of III–V group compound semiconductor according to the present invention includes a first stack and a second stack. The first stack includes a semiconductor stack having an n-type semiconductor layer, an active layer and a p-type semiconductor layer stacked successively. A multilayered reflective structure for reflecting light emitted from the active layer is formed on a main surface of the semiconductor stack. A first metal bonding-layer is formed on the multilayered reflective structure. The second stack includes a second metal bonding-layer. The first stack and the second stack are bonded together by bonding the first metal bonding-layer and the second metal bonding-layer to each other. The multilayered reflective structure includes a transparent conductive oxide layer and a reflective metal layer adjacent thereto in this order from the side of the semiconductor stack. The thickness of the transparent conductive oxide layer is adjusted to control the light emission characteristics.

The III–V group compound semiconductor may have a composition of $Al_xIn_yGa_{1-x-y}N$ ($0 \leqq x \leqq 1$, $0 \leqq y \leqq 1$). Preferably, the multilayered reflective structure further includes, in contact with the conductive oxide layer, a metal layer that can achieve ohmic contact with the semiconductor stack.

The metal layer for achieving the ohmic contact preferably includes a metal of at least one kind selected from Ni, Pd, In, and Pt. Further, the metal layer for achieving the ohmic contact preferably has a thickness in a range from 1 nm to 20 nm.

The transparent conductive oxide layer may include at least one of indium oxide, tin oxide, zinc oxide, and titanium oxide provided with conductivity by an impurity. The transparent conductive oxide layer preferably has a thickness in a range from 1 nm to 30 μm.

Preferably, the reflective metal layer is capable of reflecting light in a wavelength range from 360 nm to 600 nm. The reflective metal layer may include a metal of at least one kind selected from Ag, Al, Rh, and Pd. Alternatively, it may include an alloy of at least two kinds selected from Ag, Bi, Pd, Au, Nd, Cu, Pt, Rh, and Ni. In particular, one of AgBi, AgNd and AgNdCu may be used preferably.

The transparent conductive oxide film may include an impurity causing a fluorescent effect, and light from the active layer may be emitted with its wavelength converted by the fluorescent effect. The impurity causing the fluorescent effect may include at least one kind selected from YAG:Ce; $La_2O_2S:Eu^{3+}$; $Y_2O_2S:Eu$; ZnS:Cu, Al; and (Ba, Mg) $Al_{10}O_{17}:Eu$, and light from the active layer may be converted to white light by the fluorescent effect.

A transparent electrode layer may be formed on the other main surface of the semiconductor stack. The transparent electrode layer may be formed of a transparent conductive oxide.

In a method of fabricating the light emitting device of III–V group compound semiconductor as described above, the transparent conductive oxide layer is preferably deposited to a controlled predetermined thickness to make the light emitting device have prescribed light emission characteristics. The transparent conductive oxide layer may be deposited by sputtering.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 3:
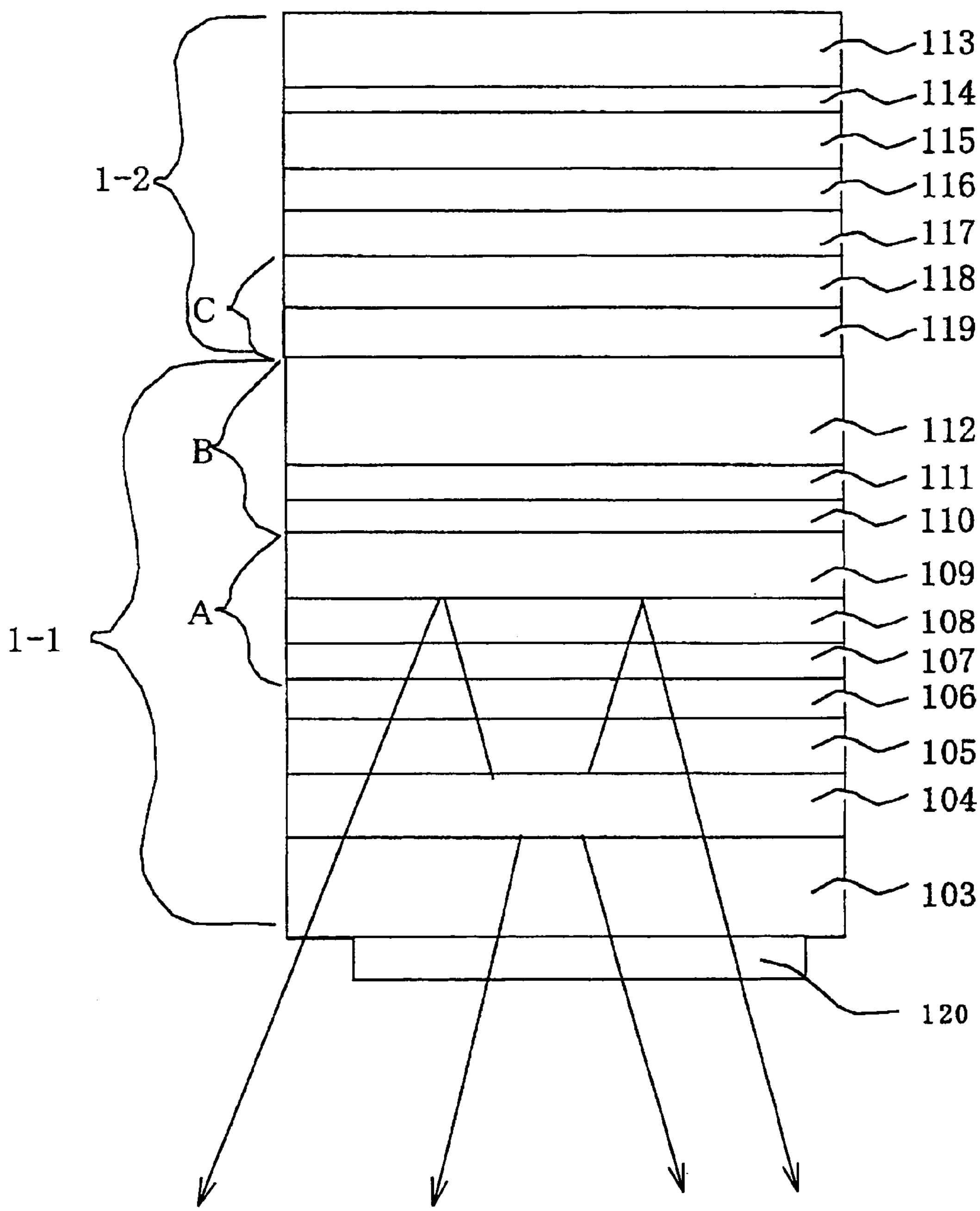
FIG. 3 is a schematic cross sectional view showing the light emitting device of the III group nitride semiconductor fabricated using the stacks of FIGS. 1 and 2.

FIG. 3 shows, in schematic cross section, a light emitting device of III group nitride semiconductor according to a first embodiment of the present invention. In this light emitting device, a transparent n-electrode 120 is formed on a lower surface of a stack 1-1 including a plurality of III group nitride semiconductor layers including a light emitting layer. Bonded on a multiple metal bonding-layer B at the upper side of stack 1-1 is a conductive substrate electrode 1-2 which includes a multiple metal bonding-layer C. Multiple metal bonding-layers B and C are bonded to each other.

Figure 1:
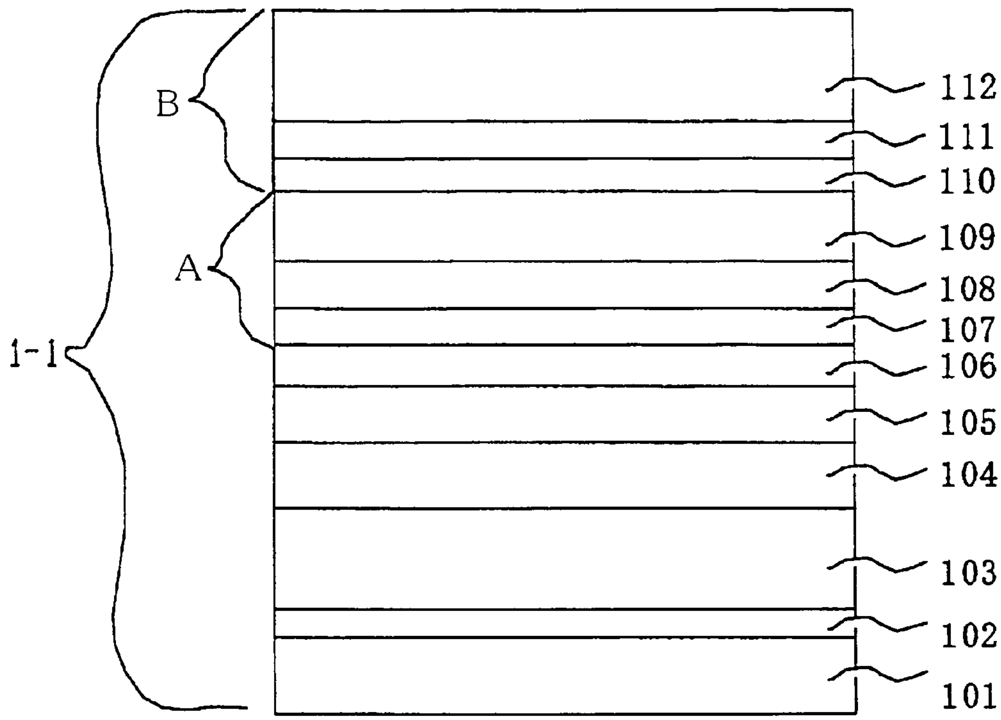
FIG. 1 is a schematic cross sectional view of a stack that is used for fabrication of a light emitting device of III group nitride semiconductor according to an embodiment of the present invention.

To produce the light emitting device of FIG. 3, firstly, stack 1-1 as shown in FIG. 1 is fabricated. In fabrication of stack 1-1, a GaN buffer layer 102, an n-type GaN layer 103, a MQW (multiple quantum well) active layer 104 as a light emitting layer of four pairs of $In_{0.08}Ga_{0.92}N$ sub-layers and GaN sub-layer stacked alternately, a p-type AlGaN layer 105, and a p-type GaN layer 106 are formed successively on a sapphire substrate 101. Further, a transparent ohmic contact layer 107, an ITO (indium tin oxide) layer 108, a reflective metal film 109 for reflecting light from the active layer, an Mo film 110 and a Pt film 111 as diffusion preventing films, and an Au film 112 for bonding are formed successively on p-type GaN layer 106,. The Pt film is capable of not only preventing diffusion, similarly to the Mo film, but also facilitating bonding between the Mo film and the Au film.

More specifically, in fabrication of stack 1-1 of FIG. 1, the III group nitride semiconductor layers are stacked on sapphire substrate 101 using an MOCVD (Metal Organic Chemical Vapor Deposition) method. To this end, firstly, sapphire substrate 101 is mounted on a susceptor in a reactive chamber, and baked at 1200° C. in $H_2$ atmosphere. Thereafter, at the same substrate temperature, with $H_2$ as a carrier gas, trimethyl gallium (TMG) and ammonium ($NH_3$) are used to grow GaN buffer layer 102 to a thickness of 30 nm, and TMG, $NH_3$ and monosilane ($SiH_4$) as a dopant are used to grow n-type GaN layer 103 to a thickness of 4–10 μm.

Subsequently, at a substrate temperature of 750° C., trimethyl indium (TMI), TMG and $NH_3$ are used to grow 3 nm-thick $In_{0.08}Ga_{0.92}N$ well sub-layers and 9 nm-thick GaN barrier sub-layers alternately for four pairs, to form MQW active layer 104.

Next, at a substrate temperature of 1100° C., trimethyl aluminum (TMA), TMG, $NH_3$, and bis-cyclopentadienyl magnesium ($Cp_2Mg$) as a dopant are used to grow Mg-doped p-type $Al_{0.08}Ga_{0.92}N$ layer 105 to a thickness of 30 nm. Lastly, at the same substrate temperature, TMG, $NH_3$ and $Cp_2Ma$ are used to grow Mg-doped p-type GaN layer 106 to a thickness of 120 nm.

With the substrate temperature lowered to a room temperature, the stack is taken out to the atmosphere. Thereafter, the stack is introduced into a heat treatment furnace and subjected to heat treatment at 800° C. for 15 minutes in $N_2$ atmosphere, to activate p-type conductivity of the Mg-doped semiconductor layers.

After conducting organic cleaning of the heat-treated stack, a 1 to 20 nm-thick palladium (Pd) layer as the transparent ohmic contact layer 107 is formed by vacuum evaporation on p-type GaN layer 106 at a substrate temperature of 100° C. On condition that Pd layer 107 can achieve ohmic contact, ITO layer 108 to be formed later thereon allows spreading of electrical current in the lateral direction. Thus, Pd layer 107 can further be reduced in thickness, preferably to 1 to 7 nm. The stack having the layers formed up to Pd layer 107 is annealed in a vacuum at 500° C. for five minutes.

On Pd layer 107, ITO layer 108 that is a transparent and electrically conductive oxide film is formed to a thickness of 1 nm by a sputtering device. On ITO layer 108, an Ag layer as reflective metal layer 109 is formed to a thickness of 150 nm at a substrate temperature of 100° C. by vacuum evaporation.

Also by vacuum evaporation, 10 nm-thick Mo film 110 and 15 nm-thick Pt film 111 are formed in this order for preventing diffusion, and then Au film 112 for facilitating metallic bonding is formed to a thickness of 0.5 μm.

Figure 2:
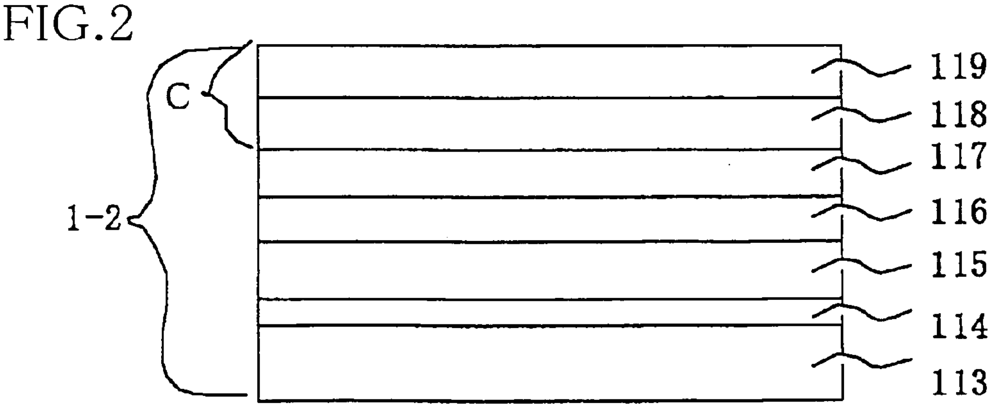
FIG. 2 is a schematic cross sectional view of another stack that is used together with the stack of FIG. 1 for fabrication of the light emitting device of the III group nitride semiconductor.

Next, as shown in the schematic cross sectional view of FIG. 2, conductive substrate electrode 1-2 having multiple metal bonding-layer C to be bonded to stack 1-1 is fabricated. In conductive substrate electrode 1-2, a Ti film 114, an Al film 115, a Mo film 116, a Pt film 117, an Au film 118, and a metal film 119 of 80 wt % Au—Sn alloy are stacked successively on a (100) plane of an n-type Si substrate 113 doped with an impurity for making the substrate conductive.

In fabrication of conductive substrate electrode 1-2 of FIG. 2, n-type Si substrate 113 is subjected to organic cleaning and etched using a 5% HF solution. Thereafter, 15 to 30 nm-thick Ti film 114 capable of achieving ohmic contact with n-type Si substrate 113, 300 nm-thick Al film 115, 8 to 10 nm-thick Mo film 116, and 15 nm-thick Pt film 117 for preventing diffusion of the metal films, are successively formed by vacuum evaporation at a substrate temperature of 100° C. Further, 1 μm-thick Au film 118 and 4.5 μm-thick 80 wt % Au—Sn layer 119 are successively formed thereon by evaporation so as to facilitate bonding with the multiple metal bonding-layer B of stack 1-1 shown in FIG. 1. Conductive substrate electrode 1-2 shown in FIG. 2 is thus obtained.

Next, as shown in FIG. 3, stack 1-1 and conductive substrate electrode 1-2 are bonded together such that Au film 112 of multiple metal bonding-layer B and AuSn film 119 of multiple metal bonding-layer C contact each other. The bonding may be carried out under a pressure of 100–200 $N/cm^2$ at a temperature of 280–320° C. corresponding to a range from the eutectic point of the AuSn alloy to about 40° C. higher than that point.

Thereafter, to remove sapphire substrate 101 used to grow the III group nitride semiconductor layers thereon, the stack is irradiated from the sapphire substrate 101 side with light from a solid laser having a wavelength to be absorbed by GaN. For such laser light, it is possible to use pulsed laser light having an energy density of 10 $\mu J/cm^2$ to 100 $mJ/cm^2$, which can remove sapphire substrate 101, GaN buffer layer 102, and a part of n-type GaN layer 103. In this state, the exposed n-type GaN layer 103 includes defects due to the laser light irradiation. Thus, with the Si substrate side being attached to a base (not shown) with electron wax, n-type GaN layer 103 is ground and/or polished by about 1–2 μm in thickness. The thickness to be ground and/or polished is preferably selected such that n-type GaN layer 103 remains and then the grounding and/or polishing would not damage the active layer. Thereafter, the stack is separated from the base, and the remaining electron wax is removed by organic cleaning.

On the cleaned n-type GaN layer 103, an ITO layer of 100 nm thickness is deposited by sputtering. With a photoresist (not shown) applied to the ITO layer, part of the ITO layer is removed by photolithography and etching with $FeCl_3$ to form a transparent electrode 120 as shown in FIG. 3. Thereafter, the stack is divided into chips of 200 μm square each, using a scribing or dicing device. The thus fabricated light emitting device of the III group nitride semiconductor shown in FIG. 3 has an emission wavelength of 470 nm. Here, a light emitting device having an emission wavelength in a range from 360 nm to 600 nm can be fabricated by controlling the composition ratio of $In_xGa_{1-x}N$ ($0<x\leqq 1$) in MQW active layer 104 formed of four pairs of $In_{0.08}Ga_{0.92}N$ sub-layers and GaN sub-layers stacked alternately.

As described above, in the present embodiment, stacks 1-1 and 1-2 are bonded such that multiple metal bonding-layer B in stack 1-1 and multiple metal bonding-layer C in conductive substrate electrode 1-2 contact each other. Thus, it is possible to form the electrodes on both main surfaces of the light emitting device of the III group nitride semiconductor. Further, since metal layer 109 having high reflectance for light of a wavelength of 360–600 nm from light emitting layer 104 is inserted in the multilayered reflective structure A to contact ITO layer 108, and since n-electrode 120 of ITO having high transmittance is employed, it is also possible to improve the efficiency of externally extracting light from the light emitting device of the III group nitride semiconductor.

Figure 7:
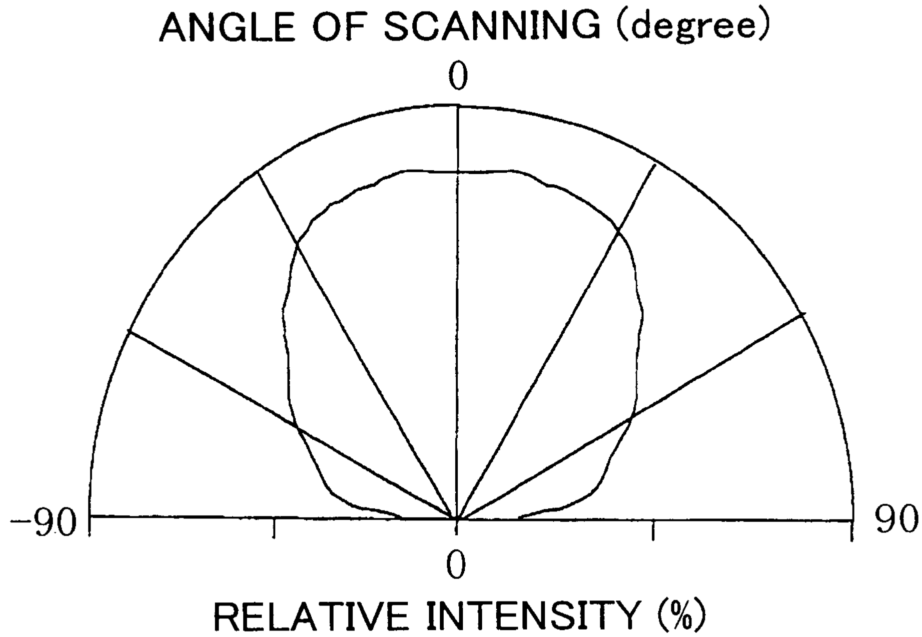
FIG. 7 is a semicircular graph showing an example of light emission characteristics of the light emitting device of the III group nitride semiconductor shown in FIG. 3.

FIG. 7 shows light emission characteristics of the light emitting device of FIG. 3. In the semicircular graph of FIG. 7, the axis in the radial direction represents relative intensity (%) of the light emission, and the circumferential direction represents the angle (degree) of angular scanning. Specifically, the scanning angle of 0 degree indicates the emission angle of light directed downward vertically beneath the device of FIG. 3. The scanning angles of 90 degrees and −90 degrees indicate the emission angles of light in the lateral directions. The curved line in the semicircular graph indicates the relative intensity (%) of light at the emission angle in the radial direction. As results of further investigation, FIGS. 8 and 9 similar to FIG. 7 show the emission characteristics of the light emitting devices having thicknesses of ITO film 108 in FIG. 3 changed to 1 μm and 30 μm, respectively.

Figure 8:
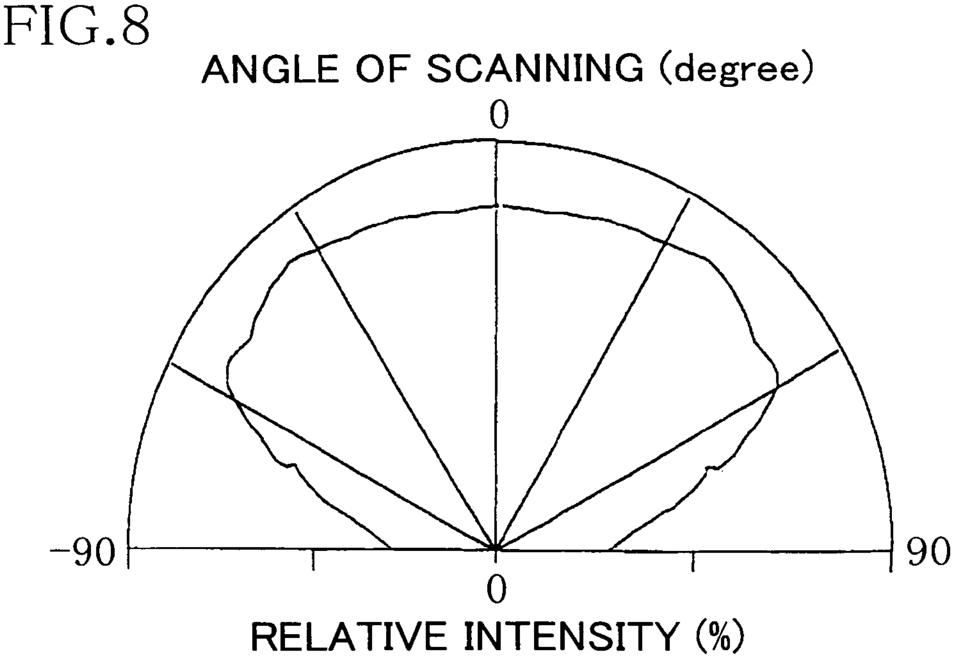
FIG. 8 is a semicircular graph showing another example of the light emission characteristics of the light emitting device of the III group nitride semiconductor shown in FIG. 3.
Figure 9:
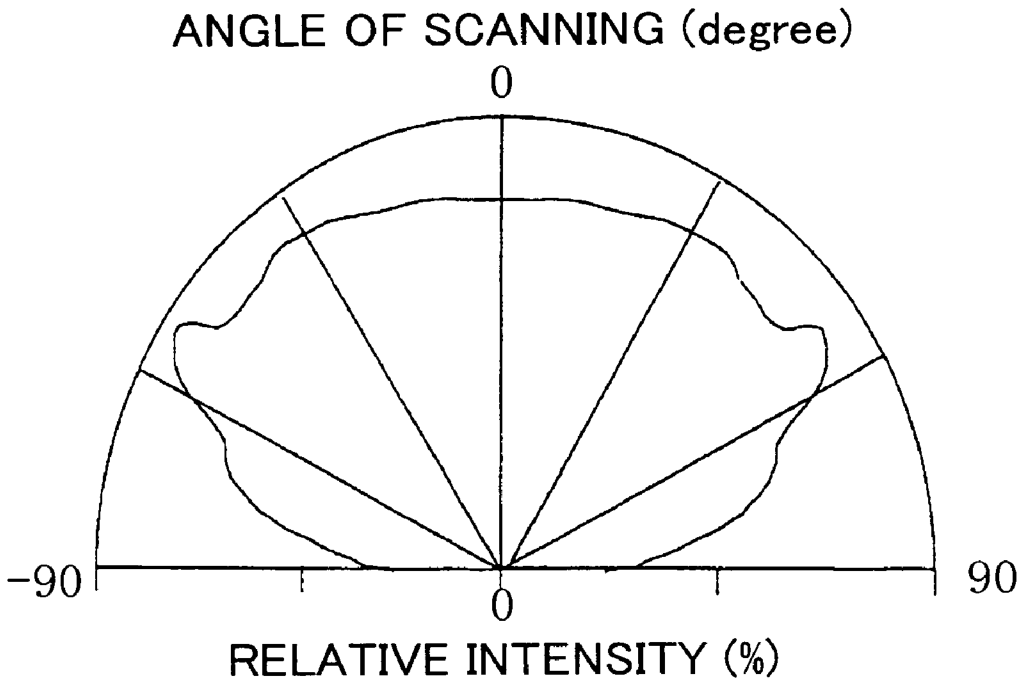
FIG. 9 is a semicircular graph showing yet another example of the light emission characteristics of the light emitting device of the III group nitride semiconductor shown in FIG. 3.
Figure 10:
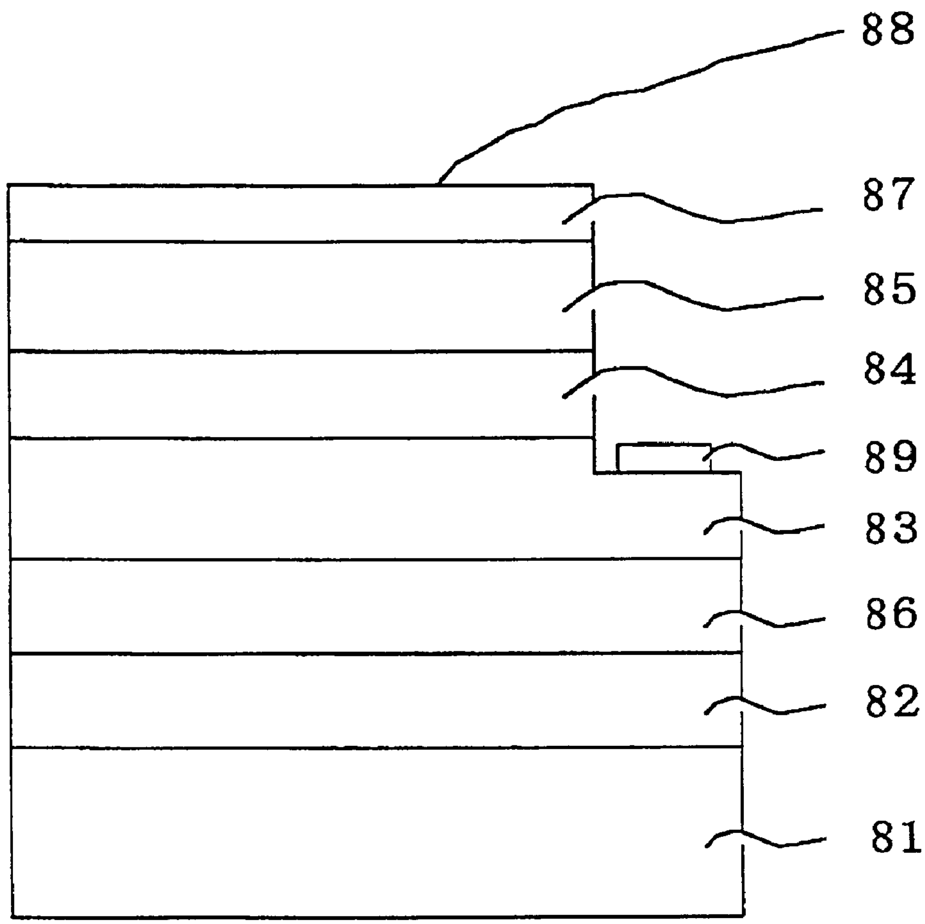
FIG. 10 is a schematic cross sectional view of a conventional light emitting device of compound semiconductor which is formed on a sapphire substrate and includes a reflective layer.

It is understood from FIGS. 7–9 that light extracted from the transparent electrode 120 side can be increased by increasing the thickness of ITO film 108. More specifically, it is understood that the emission characteristics can be controlled by controlling the thickness of ITO film 108 in the light emitting device, without the need of designing the shape(s) of the cup and/or the mold resin after division into chips. Even when ITO film 108 is thickened up to 100 μm, on the other hand, the emission characteristics of the light emitting device of the III group nitride semiconductor remain similar as in the case of ITO film 108 of 30 μm thickness. Accordingly, ITO film 108 has a thickness preferably in a range from 1 nm to 100 μm and more preferably in a range from 1 nm to 30 μm.

Second Embodiment

Figure 6:
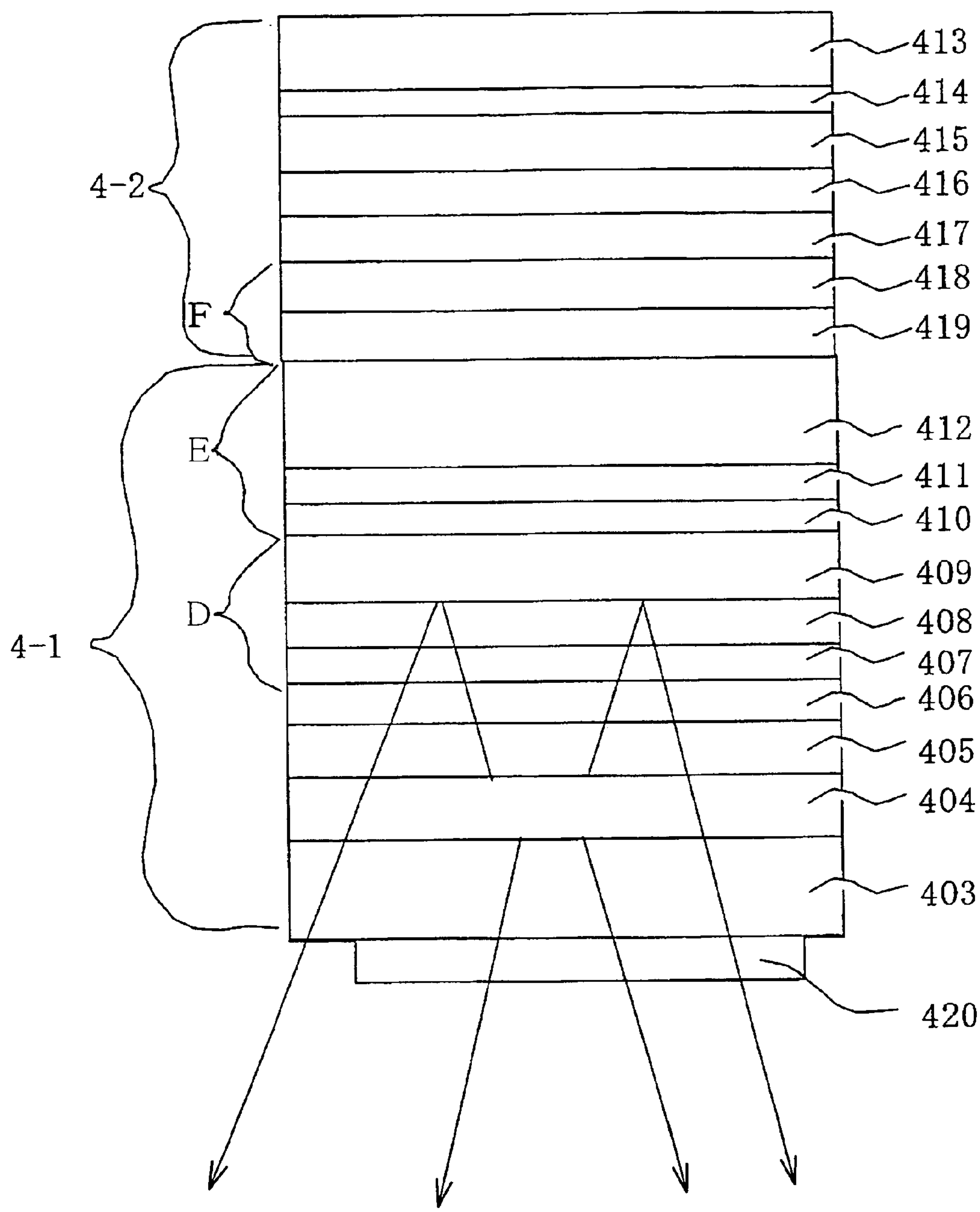
FIG. 6 is a schematic cross sectional view of the light emitting device of the III group nitride semiconductor fabricated using the stacks of FIGS. 4 and 5.

FIG. 6 shows, in schematic cross section, a light emitting device of III group nitride semiconductor according to a second embodiment of the present invention. In this light emitting device, a transparent n-electrode 120 is formed on the lower surface of a stack 4-1 including a plurality of III group nitride semiconductor layers including a light emitting layer. A conductive substrate electrode 4-2 is bonded to a multiple metal bonding-layer E at the upper side of stack 4-1. Conductive substrate electrode 4-2 includes a multiple metal bonding-layer F, and then multiple metal bonding-layers E and F are bonded to each other.

Figure 4:
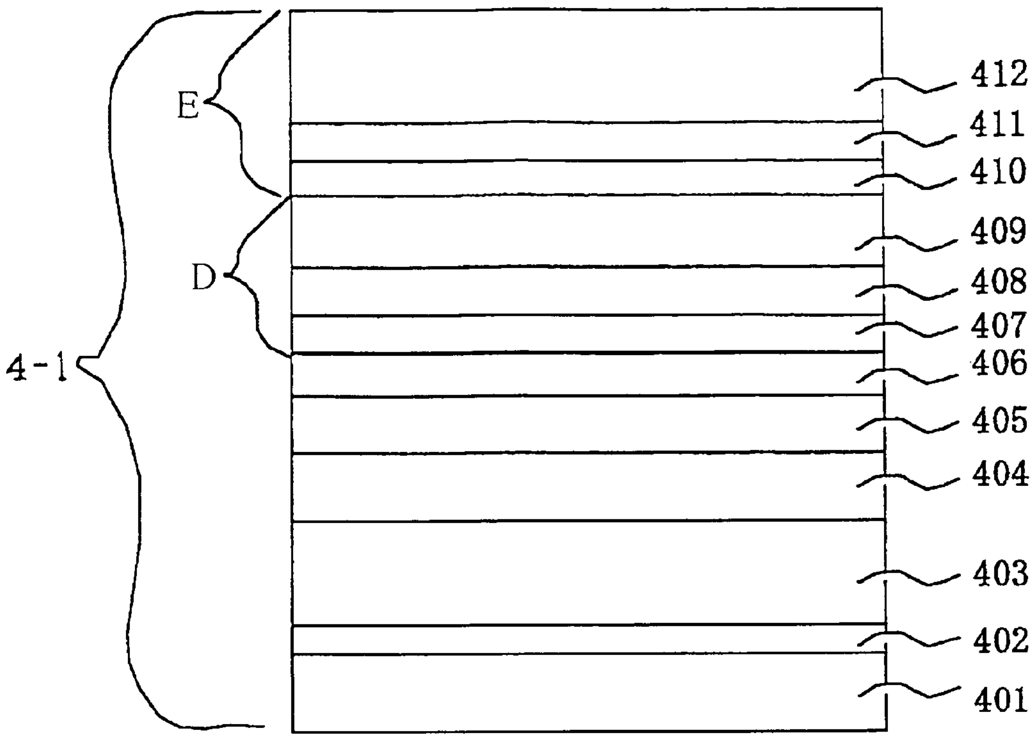
FIG. 4 is a schematic cross sectional view of a stack that is used for fabrication of a light emitting device of III group nitride semiconductor according to another embodiment of the present invention.

To obtain the light emitting device of FIG. 6, firstly, stack 4-1 as shown in FIG. 4 is fabricated. In fabrication of stack 4-1, an AlN intermediate layer 402, an n-type GaN layer 403, an MQW active layer 404 as a light emitting layer formed of four pairs of $In_{0.08}Ga_{0.92}N$ sub-layers and GaN sub-layers stacked alternately, a p-type AlGaN layer 405, and a p-type GaN layer 406 are formed successively on a (111) plane of a conductive Si substrate 401. Further, a transparent ohmic contact layer 407, an ITO layer 408, a reflective metal film 409 for reflecting light from the active layer, an Mo film 410 and a Pt film 411 as diffusion preventing films, and an Au film 412 for bonding are formed successively on p-type GaN layer 406.

More specifically, in fabrication of stack 4-1 of FIG. 4, firstly, conductive Si substrate 401 having its (111) main surface is subjected to organic cleaning and etched with a 5% HF solution. Further, the substrate is subjected to $H_2$ cleaning at 1200° C. in an MOCVD system, and AlN intermediate layer 402 is deposited to a thickness of 100 nm at the same substrate temperature. On AlN intermediate layer 402, similarly as in the case of the first embodiment, n-type GaN layer 403, MQW active layer 404 formed of four pairs of $In_{0.08}Ga_{0.92}N$ sub-layers and GaN sub-layers alternately stacked, p-type AlGaN layer 405, and p-type GaN layer 406 are grown successively. Thereafter, to activate p-type conductivity of the Mg-doped semiconductor layers, the stack of the semiconductor layers is subjected to heat treatment at 800° C. for 15 minutes in $N_2$ atmosphere in a heat treatment furnace.

Next, as an ohmic contact layer for p-type GaN layer 406, transparent Pd layer 407 is formed to a thickness of 1.5 nm by vacuum evaporation at a substrate temperature of 100° C. Subsequently, ITO layer 408 as a transparent conductive oxide film is formed on Pd layer 407 by a sputtering device. On ITO layer 408, reflective metal layer 409 of Ag or an Ag alloy is formed to a thickness of 150 nm by vacuum evaporation at a substrate temperature of 100° C. Reflective metal layer 409 has light reflecting capability for reflecting light emitted from light emitting layer 404 to the p-electrode side. Next, 10 nm-thick Mo film 410 is formed by evaporation for the purpose of preventing diffusion of ITO layer 408 and Ag reflective metal layer 409. Subsequently, 15 nm-thick Pt film 411 is formed by evaporation, and then 1 μm-thick Au film 412 is formed by evaporation for the purpose of facilitating bonding with conductive substrate electrode 4-2 afterwards. Stack 4-1 of FIG. 4 is thus fabricated.

Figure 5:
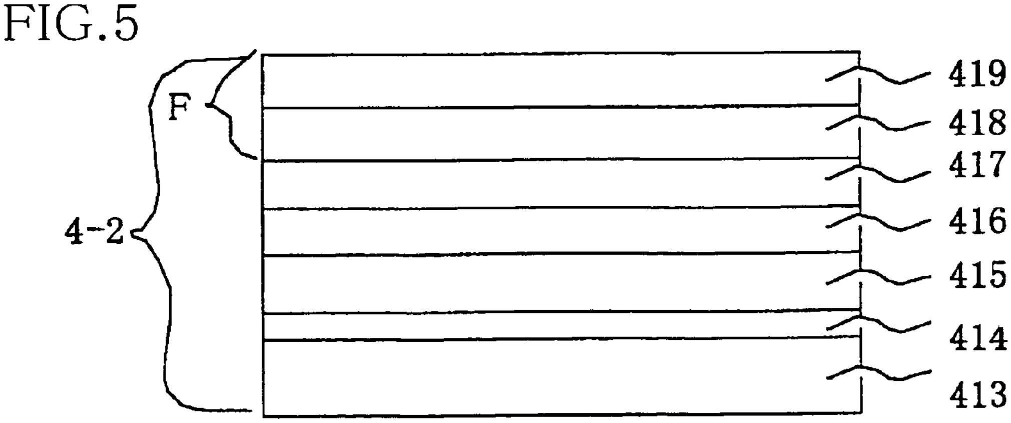
FIG. 5 is a schematic cross sectional view of another stack that is used together with the stack of FIG. 4 for fabrication of the light emitting device of the III group nitride semiconductor.

Next, as shown in the schematic cross sectional view of FIG. 5, conductive substrate electrode 4-2 having a multiple metal bonding-layer F to be bonded to stack 4-1 is fabricated. In conductive substrate electrode 4-2, a Ti film 414, an Al film 415, a Mo film 416, a Pt film 417, an Au film 418, and a metal film 419 of AuSn alloy are successively formed on a (100) main surface of a conductive n-type Si substrate 413.

In fabrication of conductive substrate electrode 4-2 of FIG. 5, firstly, Si substrate 413 is subjected to organic cleaning, followed by etching with a 5% HF solution. Thereafter, 15 to 30 nm-thick Ti film 414 capable of making ohmic contact with n-type Si substrate 413, 300 nm-thick Al film 415, and 8 to 10 nm-thick Mo film 416 and 15 nm-thick Pt film 417 for preventing diffusion of the metal layers are successively formed by vacuum evaporation at a substrate temperature of 100° C. Further, to facilitate bonding with multiple metal bonding-layer E of stack 4-1 in FIG. 4, 1 μm-thick Au film 418 is formed by evaporation, and then 3 μm-thick AuSn film 419 is formed by evaporation thereon. Conductive substrate electrode 4-2 shown in FIG. 5 is thus obtained.

Next, as shown in FIG. 6, stack 4-1 and conductive substrate electrode 4-2 are bonded such that Au film 412 in multiple metal bonding-layer E and AuSn film 119 in multiple metal bonding-layer F contact each other. The bonding may be carried out under a pressure of 100–200 $N/cm^2$ at 280–320° C. corresponding to a temperature in a range from the eutectic point of the AuSn alloy to about 40° C. higher than that point.

In the above-described example of the second embodiment, AlN has been used for intermediate layer 402 between Si substrate 401 and n-type GaN layer 403. It is of course possible to use $Al_xIn_yGa_{1-x-y}N$ ($0<x\leqq 1$, $0\leqq y\leqq 1$, $x+y=1$) instead.

Thereafter, to remove Si substrate 401 used to grow the III group nitride semiconductor layers thereon, the stack is bonded using acid-resistant wax such that Si substrate 413 contacts an acid-resistant substrate (not shown). Si substrate 401 is removed using a solution having a composition of HF:nitric acid ($HNO_3$):acetic acid ($CH_3COOH$)=5:2:2. At this time, AlN intermediate layer 402 can serve as an etching stopper. Thereafter, the acid-resistant substrate (not shown) is removed from Si (111) substrate 413 by organic cleaning for removing wax, and then AlN intermediate layer 402 is removed by an RIE (reactive ion etching) method at a temperature lower than the eutectic point of the AuSn alloy, to expose n-type GaN layer 403.

On the exposed n-type GaN layer 403, an ITO layer is deposited to a thickness of 100 nm by sputtering. With a photoresist (not shown) applied on the ITO layer, part of the ITO layer is removed by photolithography and etching with $FeCl_3$ to form an electrode 420, as shown in FIG. 6. Thereafter, the stack is divided into chips of 200 μm square each. The light emitting device of the III group nitride semiconductor of FIG. 6 thus fabricated has an emission wavelength of 470 nm. Here, a light emitting device having an emission wavelength in a range from 360 nm to 600 nm can be fabricated by controlling the composition ratio of $In_xGa_{1-x}N$ ($0<x\leqq 1$) in MQW active layer 404 formed of four pairs of $In_{0.08}Ga_{0.92}N$ sub-layers and GaN sub-layers stacked alternately.

As described above, in the second embodiment, electrodes can be formed on both main surfaces of the light emitting device of the III group nitride semiconductor, since stacks 4-1 and 4-2 are bonded such that multiple metal bonding-layer E of stack 4-1 and multiple metal bonding-layer F of conductive substrate electrode 4-2 contact each other. Further, the efficiency of externally extracting light from the light emitting device of the III group nitride semiconductor is improved, since Ag layer 409 having high reflectance for light from light emitting layer 404 is inserted in a multilayered reflective structure D so as to contact ITO layer 408. Still further, by controlling the thickness of ITO film 408 in the light emitting device of the III group nitride semiconductor of the second embodiment, effects similar to those in the case of the first embodiment can be obtained.

Third Embodiment

A light emitting device of III group nitride semiconductor according to a third embodiment of the present invention has a structure similar to those of the first and second embodiments, and thus it can be fabricated with the steps similar to those for the first and second embodiments. In the third embodiment, however, ITO layer 108 or 408 in the first or second embodiment is doped with an impurity ($La_2O_2S$:$Eu^{3+}$) causing a fluorescent effect. As a result, light externally extracted from the light emitting device of the III group nitride semiconductor can be converted to white light. Further, by controlling the thickness of ITO layer 108 or 408, effects similar to those in the first and second embodiments can also be obtained.

Moreover, in the third embodiment, for the impurity causing the fluorescent effect to be added to the ITO layer, at least one of (YAG:Ce), ($La_2O_2S$:$Eu^{3+}$), ($Y_2O_2S$:Eu), (ZnS:Cu, Al) and ((Ba, Mg) $Al_{10}O_{17}$:Eu) may be employed to obtain the similar effect.

Although the Au layer and the 80% Au—Sn layer have been employed for bonding in the first through third embodiments, the composition of the AuSn alloy may be changed and, for example, 70% Au—Sn may be employed. Further, an Au layer and an Sn layer; or an AgCuSn layer and another AgCuSn layer; or an Au layer and an AuSi layer may also be employed for bonding. When the AgCuSn alloy is used, the bonding temperature and bonding pressure may be set to 200–260° C. and 100–200 N/$cm^2$, respectively. When Au and AuSi are used, the bonding temperature and bonding pressure may be set to 270–380° C. and 100–200 N/$cm^2$, respectively.

Further, although the light emitting devices of the III group nitride semiconductor has been explained in the above embodiments, it is needless to say that the N element in the III group nitride semiconductor may be partially substituted with As, P and/or Sb, as well known in the art. Moreover, although the conductive Si substrate has been used as the conductive substrate for fabrication of conductive substrate electrode 1-1, 4-1, any of a conductive GaAs substrate, a conductive ZnO substrate and a conductive GaP substrate may also be used instead. Further, instead of the Pd layer used as the ohmic contact layer, at least one metal of Ni, In and Pt may also be employed to obtain similar effects. Still further, a spinel substrate, a SiC substrate or the like may also be employed in place of the insulative sapphire substrate.

The above-described grinding and/or polishing of n-type GaN layer 103 after laser light irradiation is carried out for the purposes of suppressing adverse effects caused by occurrence of defects in the n-type GaN layer due to the laser irradiation as well as by part of GaN buffer layer 102 remaining on n-type GaN layer 103. Here, it is of course possible to eliminate an unnecessary layer by grinding and/or polishing even in the case that an AlN buffer layer is used instead of GaN buffer layer 102, that an $Al_xIn_yGa_{1-x-y}N$ ($0 \leqq x$, $0 \leqq y$, $x+y \leqq 1$) layer is formed instead of n-type GaN layer 103, or that any additional layer is stacked. Further, the RIE method may be employed for polishing n-type GaN layer 103.

In the above-described embodiments, the Ag film as the light reflecting film having high reflectance in the wavelength range of 360–600 nm may be replaced with a light reflecting film using at least one of Al, Rh and Pd. Further, an alloy containing at least two of Ag, Bi, Pd, Au, Nd, Cu, Pt, Rh and Ni, particularly AgBi, AgNd or AgNdCu, may also preferably be used for the light reflecting film.

Further, in the above-described embodiments, the ITO film has been used for the transparent conductive oxide film. Alternatively, tin oxide, indium oxide, zinc oxide, or titanium oxide doped with an impurity to render it conductive, may be employed.

The Ti film or the Al film serving as the ohmic contact film may be replaced with an Au film or an AuSb alloy film. The active layer may be made of a single or multiple quantum well layer, and it also may be non-doped or doped with Si, As or P. The well and barrier sub-layers in the MQW active layer may be formed of only the InGaN sub-layers or formed of the InGaN and GaN sub-layers. The order of forming the p-electrode and the n-electrode is not restricted and either of them may be formed first. The way of division into chips is not restricted to scribing or dicing, and laser light may be focused on the scribing line for division into chips. The size of the chip is not restricted to 200 μm square, and it may be 100 μm square or 1 mm square.

As described above, according to the present invention, it is possible to provide a light emitting device for emitting blue or white light fabricated using a light emitting element of III-V group compound semiconductor, which is improved in efficiency of externally extracting light as well as in controllability of its emission characteristics.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light emitting device of a III–V group compound semiconductor comprising a first stack and a second stack, wherein said first stack includes a semiconductor stack having an n-type semiconductor layer, an active layer and a p-type semiconductor layer stacked successively, a multilayered reflecting-structure for reflecting light emitted from said active layer is formed on one main surface of said semiconductor stack, a first metal bonding-layer is formed on said multilayered reflecting-structure, a transparent electrode layer is formed on the other main surface of said semiconductor stack, said second stack includes a second metal bonding-layer, said first stack and said second stack are bonded together by bonding said first metal bonding-layer and said second metal bonding-layer to each other, said multilayered reflecting-structure includes a transparent conductive oxide layer and a reflecting metal layer adjacent thereto in this order from the said semiconductor stack, and a thickness of said transparent conductive oxide layer is adjusted in a range from 1 nm to 30 μm to control light emission characteristics on the transparent electrode layer side.

2. The light emitting device of III–V group compound semiconductor according to claim 1, wherein said III–V group compound semiconductor has a composition of $Al_xIn_yGa_{1-x-y}N$ ($0 \leqq x \leqq 1$, $0 \leqq y \leqq 1$).

3. The light emitting device of III–V group compound semiconductor according to claim 1, wherein said multilayered reflective structure further includes, in contact with said conductive oxide layer, a metal layer that can achieve ohmic contact with said semiconductor stack.

4. The light emitting device of III–V group compound semiconductor according to claim 3, wherein said metal layer for achieving the ohmic contact includes a metal of at least one kind selected from Ni, Pd, In, and Pt.

5. The light emitting device of III–V group compound semiconductor according to claim 3, wherein said metal layer for achieving the ohmic contact has a thickness in a range from 1 nm to 20 nm.

6. The light emitting device of III–V group compound semiconductor according to claim 1, wherein said transparent conductive oxide layer includes at least one of indium oxide, tin oxide, zinc oxide, and titanium oxide provided with conductivity by an impurity.

7. The light emitting device of III–V group compound semiconductor according to claim 1, wherein said reflective metal layer is capable of reflecting light in a wavelength range from 360 nm to 600 nm.

8. The light emitting device of III–V group compound semiconductor according to claim 1, wherein said reflective metal layer includes a metal of at least one kind selected from Ag, Al, Rh, and Pd.

9. The light emitting device of III–V group compound semiconductor according to claim 1, wherein said reflective metal layer includes an alloy of at least two kinds selected from Ag, Bi, Pd, Au, Nd, Cu, Pt, Rh, and Ni.

10. The light emitting device of III–V group compound semiconductor according to claim 9, wherein one of AgBi, AgNd and AgNdCu is used as the alloy for said reflective metal layer.

11. The light emitting device of III–V group compound semiconductor according to claim 1, wherein said transparent conductive oxide film has an impurity causing a fluorescent effect, and light from said active layer is emitted with its wavelength converted by said fluorescent effect.

12. The light emitting device of III–V group compound semiconductor according to claim 11, wherein the impurity causing said fluorescent effect includes at least one kind selected from YAG:Ce, $La_2O_2S:Eu^{3+}$; $Y_2O_2S:Eu$; ZnS:Cu, Al; and (Ba, Mg) $Al_{10}O_{17}:Eu$, and light from said active layer is converted to white light by said fluorescent effect.

13. The light emitting device of III–V group compound semiconductor according to claim 1, wherein said transparent electrode layer includes a transparent conductive oxide.

14. A method for fabricating the light emitting device of III–V group compound semiconductor of claim 1, wherein said transparent conductive oxide layer is deposited to a prescribed thickness to make said light emitting device have prescribed light emission characteristics.

15. The method for fabricating the light emitting device of III–V group compound semiconductor according to claim 14, wherein said transparent conductive oxide layer is deposited by sputtering.

* * * * *